United States Patent
Weyers et al.

(10) Patent No.: US 9,472,544 B2
(45) Date of Patent: Oct. 18, 2016

(54) SEMICONDUCTOR DEVICE COMPRISING ELECTROSTATIC DISCHARGE PROTECTION STRUCTURE

(71) Applicant: Infineon Technologies Dresden GmbH, Dresden (DE)

(72) Inventors: Joachim Weyers, Hoehenkirchen (DE); Franz Hirler, Isen (DE); Anton Mauder, Kolbermoor (DE); Markus Schmitt, Neubiberg (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/682,257

(22) Filed: Apr. 9, 2015

(65) Prior Publication Data
US 2015/0311191 A1    Oct. 29, 2015

(30) Foreign Application Priority Data
Apr. 24, 2014    (DE) .................. 10 2014 105 790

(51) Int. Cl.
| | | |
|---|---|---|
| H01L 27/02 | (2006.01) | |
| H01L 23/34 | (2006.01) | |
| H01L 23/367 | (2006.01) | |

(52) U.S. Cl.
CPC .......... H01L 27/0255 (2013.01); H01L 23/34 (2013.01); *H01L 23/367* (2013.01); *H01L 23/3672* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 3,728,591 A | 4/1973 | Sunshine | |
| 5,593,918 A * | 1/1997 | Rostoker | H01L 21/76891 148/DIG. 90 |
| 8,637,388 B2 | 1/2014 | Abou-Khalil et al. | |
| 2005/0077577 A1 | 4/2005 | Manna et al. | |
| 2006/0192019 A1* | 8/2006 | Kato | G06K 19/07749 235/492 |
| 2007/0267700 A1 | 11/2007 | Russ et al. | |
| 2008/0093671 A1 | 4/2008 | Enichlmair | |
| 2011/0136300 A1* | 6/2011 | Vobecky | H01L 21/26513 438/135 |
| 2012/0249021 A1* | 10/2012 | Hamanaka | H02P 27/06 318/139 |
| 2014/0353665 A1* | 12/2014 | Fujii | H01L 21/18 257/48 |

* cited by examiner

*Primary Examiner* — Charles Garber
*Assistant Examiner* — Brigitte Paterson
(74) *Attorney, Agent, or Firm* — Eschweiler & Associates, LLC (57) ABSTRACT

A semiconductor device comprises a semiconductor body having a first surface and a second surface opposite to the first surface. The semiconductor device further comprises a first isolation layer on the first surface of the semiconductor body, and an electrostatic discharge protection structure on the first isolation layer. The electrostatic discharge protection structure has a first terminal and a second terminal. The semiconductor device further comprises a heat dissipation structure, which has a first end in contact with the electrostatic discharge protection structure and a second end which is in direct contact to an electrically isolating region.

19 Claims, 7 Drawing Sheets

SEMICONDUCTOR DEVICE COMPRISING ELECTROSTATIC DISCHARGE PROTECTION STRUCTURE

REFERENCE TO RELATED APPLICATION

This application claims priority to German Application number 10 2014 105 790.2 filed on Apr. 24, 2014.

BACKGROUND

A key component in semiconductor application is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

It is further preferred to increase the thermoelectric safe operating area of an ESD structure to achieve a predetermined electrostatic discharge robustness while having at the same time a reduced area consumption of the ESD protection structure.

It is thus desirable to provide a semiconductor device structure with enhanced ESD protection and thermal characteristics, having at the same time an optimized area efficiency.

SUMMARY

According to an embodiment of a semiconductor device, the semiconductor device comprises a semiconductor body having a first surface and a second surface opposite to the first surface. The semiconductor device further comprises a first isolation layer on the first surface of the semiconductor body, and an electrostatic discharge protection structure on the first isolation layer. The electrostatic discharge protection structure has a first terminal and a second terminal. The semiconductor device further comprises a heat dissipation structure, which has a first end in contact with the electrostatic discharge protection structure and a second end which is in direct contact to an electrically isolating region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
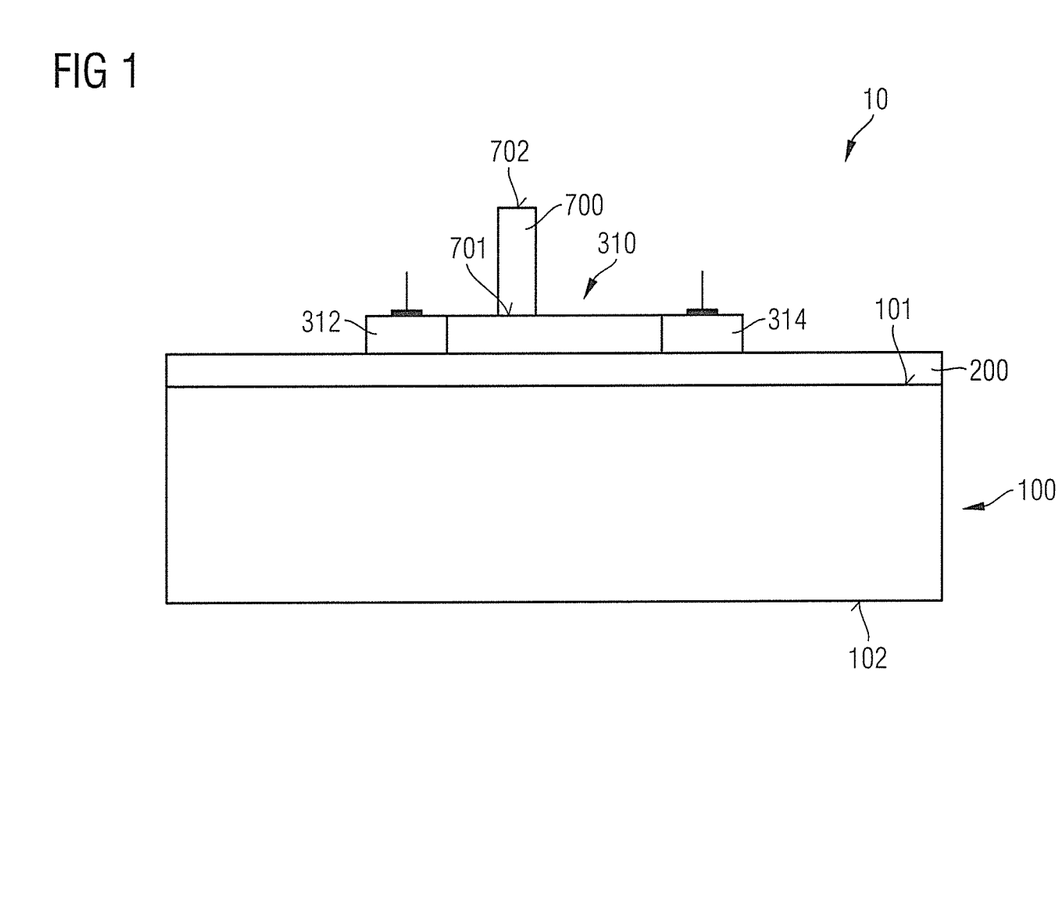
FIG. 1 is a schematic cross-sectional view of a portion of a semiconductor device in accordance with an embodiment.

FIG. 1 is a schematic cross-sectional view of a portion of a semiconductor device 10 in accordance with an embodiment. The semiconductor device 10 comprises a semiconductor body 100 having a first surface 101 and a second surface 102 opposite to the first surface 101. The semiconductor device 10 further comprises a first isolation layer 200 on the first surface 101 of the semiconductor body 100 and an electrostatic discharge protection structure 310 on the first isolation layer 200. The electrostatic discharge protection structure 310 has a first terminal 312 and a second terminal 314. The semiconductor device further comprises a heat dissipation structure 700, which has a first end 701 in contact with the electrostatic discharge protection structure 310 and a second end 702 which is in direct contact to an electrically isolating region.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs, and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a control terminal.

When reducing the chip size of the semiconductor device 10, a smaller input capacitance results in an enhanced risk of damage caused by an electrostatic discharge event between the gate and the source of the semiconductor device 10. Thus, the electrostatic discharge protection structure 310 may be applied in a power semiconductor element to protect a gate dielectric between a gate and source of a transistor from damage by dissipating energy caused by an electrostatic discharge event between a gate contact area and a source contact area.

Figure 2A:
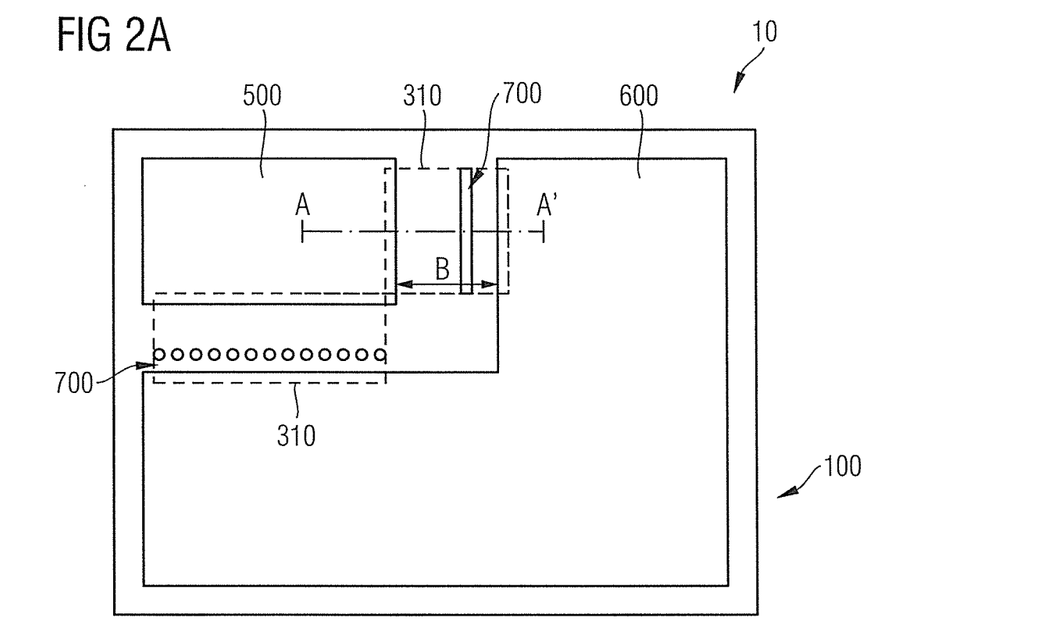
FIGS. 2A and 2B are schematic plan views of a portion of a semiconductor device in accordance with different embodiments.
Figure 2B:
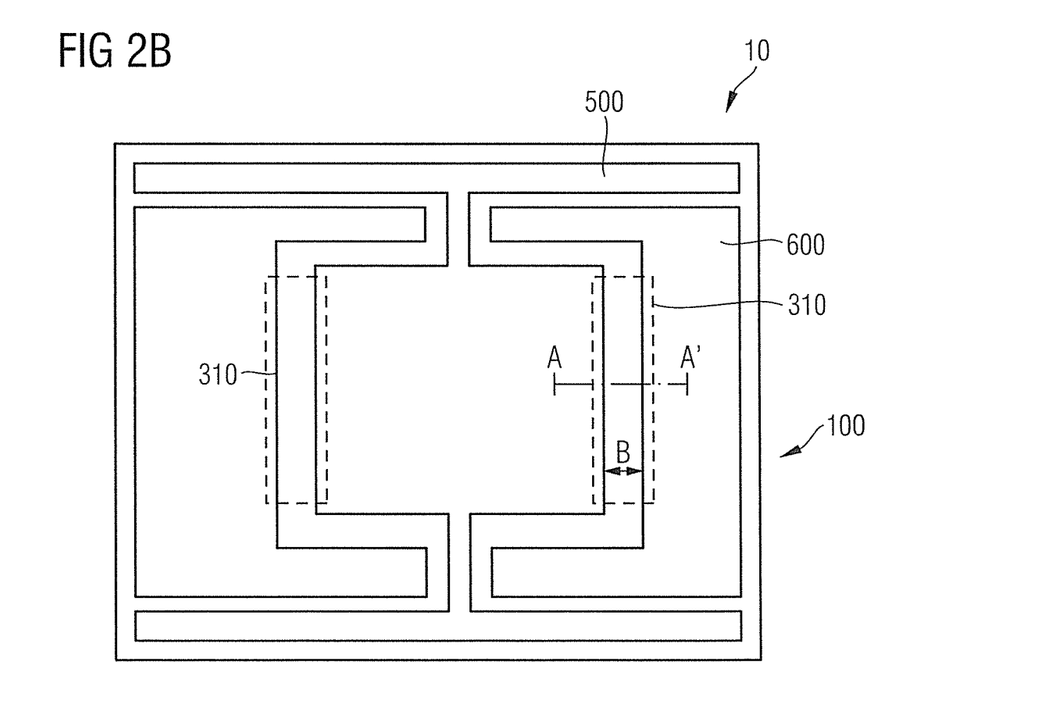

FIGS. 2A and 2B are schematic plan views of portions of a semiconductor device 10 in accordance with different embodiments. As shown in FIG. 2A, a first electrode 500 is provided in an edge portion of the semiconductor device 10 and may act as the gate contact area, which may include a gate pad. The gate pad may be used for providing a bonding or soldering contact to the first electrode 500 to be connected to an external device or element. A second electrode 600 is arranged next to the first electrode 500 and may act as the source contact area, by which the source zones of the transistor cells in the semiconductor body 100 are contacted.

When forming the semiconductor device 10 as a power semiconductor element, a resulting thickness of the metallization of the first electrode 500 and the second electrode 600 may be in a range of 1 µm to 10 µm or 3 µm to 7 µm, and the first electrode 500 and the second electrode 600 may be separated by a minimum distance B in a range of 5 µm to 20 µm or 10 µm to 15 µm. As shown in FIG. 2B, the first electrode 500 may be also be arranged in a middle part of the semiconductor device 10, wherein the second electrode 600 surrounds the first electrode 500. Possible locations of the electrostatic discharge protection structure 310 are indicated by dashed lines, wherein the indicated places are only exemplary and should not be understood as limiting.

Figure 3:
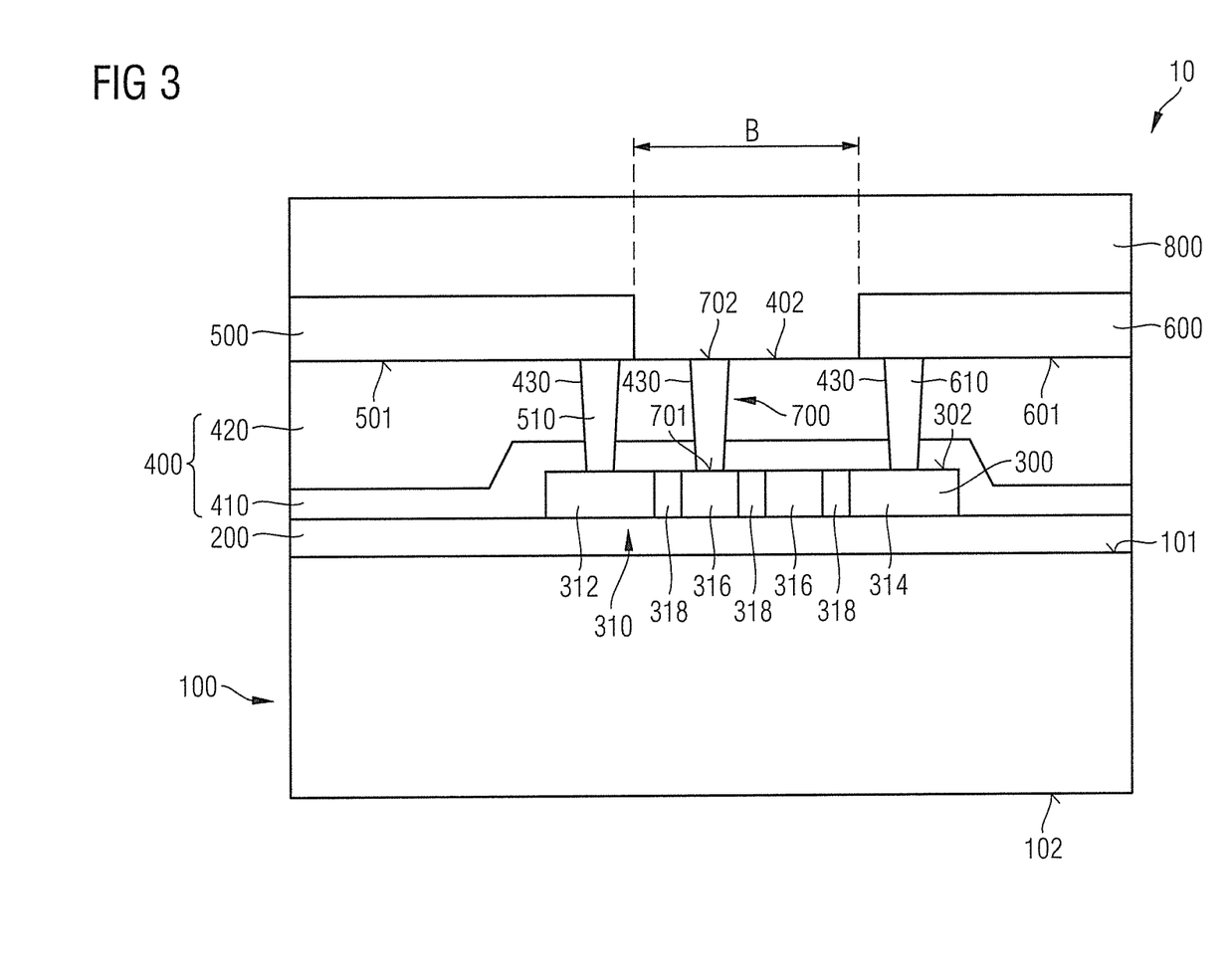
FIGS. 3 and 4 are schematic cross-sectional views of a portion of a semiconductor device taken along a section plane A-A' of FIG. 2A or FIG. 2B in accordance with different embodiments.

FIG. 3 is a schematic cross-sectional view of a portion of the semiconductor device 10 taken along a section plane A-A' of FIG. 2A or FIG. 2B in accordance with an embodiment.

The semiconductor body 100 may be provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 20 µm, for example at least 50 µm. Other embodiments may provide semiconductor bodies 100 with a thickness of several 100 µm. The semiconductor body 100 may have a rectangular shape with an edge length in the range of several millimeters. The normal to the first and second surfaces 101, 102 defines a vertical direction and directions orthogonal to the normal direction are lateral directions.

The first isolation layer 200 is formed on the first surface 101 of the semiconductor body 100. The first isolation layer 200 may include any dielectric or a combination of dielectrics adapted to isolate the semiconductor body 100 from the electrostatic discharge protection structure 310 on the first isolation layer 200. The first isolation layer 200 may include one or any combination of an oxide, nitride, oxynitride, a high-k material, an imide, an insulating resin or glass, for example. The first isolation layer 200 may include a field dielectric such as a field oxide and/or a gate dielectric such as a gate oxide. The first isolation layer 200 may include a field oxide formed e.g. by a local oxidation of silicon (LOCOS) process or STI (shallow trench isolation). The thickness of the field dielectric of the first isolation layer 200 may be in a range of 0.5 µm to 5 µm or 1 µm to 3 µm, the thickness of the gate dielectric of the first isolation layer 200 may be in a range of 5 nm to 200 nm or 40 nm to 120 nm.

The second isolation layer 400 is formed on the electrostatic discharge protection structure 310 and the first isolation layer 200. The second isolation layer may comprise silicon nitride. The second isolation layer 400 may comprise a stack of a first and a second dielectric layers 410 and 420. According to an embodiment, the first dielectric layer 410 may include a tetraethyl orthosilicate (TEOS)/undoped silicate glass (USG) film. The thickness of the first dielectric layer of the second isolation layer 400 may be in a range of 50 nm to 500 nm. The second dielectric layer 420 may include a phosphosilicate glass (PSG) or a borophosphosilicate glass (BPSG). The thickness of the second dielectric layer of the second isolation layer 400 may be in a range of 200 nm to 2 µm.

The first electrode 500 is formed on the second isolation layer 400. Next to the first electrode 500, the second electrode 600 is formed on the second isolation layer 400, which may be spaced apart from the first electrode 500 by the distance B (cf. also FIG. 2A and FIG. 2B). On the first electrode 500 and the second electrode 600, a passivation layer 800 is formed, which may include one or any combination of an imide, a nitride, an oxide or an oxynitride, for example.

The first electrode 500 and the second electrode 600 may be separate parts, e.g. due to lithographic patterning of a common metal wiring layer, wherein the semiconductor device 10 comprises only a single metal wiring layer. The first electrode 500 and the second electrode 600 may be formed as a metal layer structure, which may consist of or contain, as main constituent(s), aluminum Al, copper Cu or alloys of aluminum or copper, for example AlSi, AlCu, or AlSiCu. According to other embodiments, the first electrode 500 and the second electrode 600 may contain one, two, three or more sub-layers, each sub-layer containing, as a main constituent, at least one of nickel Ni, titanium Ti, silver Ag, gold Au, tungsten W, platinum Pt, tantalum Ta and palladium Pd. For example, a sub-layer may contain a metal nitride or a metal alloy containing Ni, Ti, Ag, Au, W, Pt, Co and/or Pd.

The electrostatic discharge protection structure 310 may include a series connection of at least one polysilicon diode. As shown in FIG. 3, the electrostatic discharge protection structure 310 may include a polysilicon layer 300 on the first isolation layer 200 having first regions 316 and second regions 318 of opposite conductivity type alternatingly arranged along a lateral direction. According to the embodiment as shown in FIG. 3, the first terminal 312 and the second terminal 314 within the polysilicon layer 300 may have the same conductivity type as the first regions 316.

In detail, the electrostatic discharge protection structure 310 may be manufactured by forming the polysilicon layer 300 of a first conductivity type on the first isolation layer 200. After forming the polysilicon layer 300, a mask layer (not shown), e.g. a hard mask layer or a resist layer is formed on the polysilicon layer 300 and is patterned by a lithographic process, such that the second regions 318 are not covered by the mask layer. In a subsequent implantation process, dopants of a second conductivity type are introduced into the exposed second regions 318 not covered by the mask layer on the polysilicon layer 300, to form the second regions 318 of the second conductivity type. Thus, each of the first regions 316 and second regions 318 comprises first dopants of the first conductivity type, and the second regions 318 further comprise second dopants of the second conductivity type overcompensating the first dopants of the first conductivity type. In another embodiment, each of the first regions 316 may comprise first dopants of the first conductivity type and the second regions 318 may comprise second dopants of the second conductivity type only, without overcompensating the first dopants of the first conductivity type. Herein, the first dopants are introduced into the first regions 316 and the second dopants are introduced into the second regions 318, respectively, in a separate process, e.g. by ion implantation and/or diffusion, wherein overlapping regions between the first and second regions 316, 318 may comprise first and second dopants due to diffusion of the dopants.

As a result, a polysilicon diode chain or string arranged in a lateral direction having alternating pn-junctions (diodes) at the region boundaries of the first and second regions in the polysilicon layer 300 is formed. In an embodiment, the doping concentrations of the regions are adapted such that a series connections of Zener diodes are formed within the polysilicon layer 300. By the number of consecutive diodes each including a first region 316 and a second region 318, the breakdown voltage of the electrostatic discharge protection structure 310 can be adjusted.

The polysilicon layer 300 deposited on the first isolation layer 200 may have a large grain-size of polysilicon. Thus, the lateral dimension of the electrostatic discharge protection structure 310 comprising a poly Zener diode chain may be e.g. in a range of 1 µm to 10 µm or 3 µm to 5 µm. By extending the electrostatic discharge protection structure 310 over a plurality of grain boundaries of the deposited polysilicon layer 300, a stable breakdown characteristic of the electrostatic discharge protection structure 310 is provided. A plurality of grain boundaries within the polysilicon layer 300 may lead to an electron mobility in a range of 1 $cm^2/Vs$ to 5 $cm^2/Vs$. In case of improving the granular structure of the polysilicon layer 300, the electron mobility may be increased to 50 $cm^2/Vs$ due to less grain boundaries within the polysilicon layer 300. A further improvement may be achieved by depositing amorphous silicon followed by a laser melting process. Such a polycrystalline silicon is called low temperature polysilicon (LTPS). The electron mobility of low temperature polysilicon is in a range of 100 $cm^2/Vs$ to 700 $cm^2/Vs$.

Even higher electron mobilities may be achieved by polycrystalline silicon having even greater grain-boundary sizes. An example of such a polycrystalline silicon is a continuous-grain-silicon (CGS), which leads to an electron mobility in a range of 500 $cm^2/Vs$ to 700 $cm^2/Vs$. By provision of a continuous grain silicon within the polysilicon layer 300, electron mobilities may be achieved, which are comparable to that within the bulk region of the semiconductor body 100.

The polysilicon layer 300 may thus comprise at least one of a low temperature polysilicon (LTPS) and a continuous grain silicon (SGS).

The length of the electrostatic discharge protection structure 310 between the first terminal 312 and the second terminal 314, respectively, may be in a range of 5 µm to 150 µm or 20 µm to 50 µm. An area of the electrostatic discharge protection structure 310 according to FIGS. 2A and 2B and FIGS. 3 to 5 may be in a range of 100 µm×50 µm×2=10000 $µm^2$, by providing a small gate pad length of 100 µm, an electrostatic discharge protection structure 310 on two orthogonal sides (FIG. 2A) or symmetrical on two opposite sides (FIG. 2B) of the gate pad. The area of the electrostatic discharge protection structure 310 may be up to 500 µm×50 µm×2=50000 $µm^2$ or up to 1000 µm×50 µm×2=100.000 $µm^2$, by providing a large gate pad length of 1000 µm. The area of the electrostatic discharge protection structure 310 does not increase the total chip area, because the diode is constructed between and partially beneath the metal.

Assuming a breakdown current of 1 mA per µm diode width, a robustness of the electrostatic discharge protection structure 310 with respect to HBM (Human Body Model) tests may be in a range of 300 V to 3 kV.

The area of the electrostatic discharge protection structure 310 may be appropriately chosen for dissipating energy caused by an electrostatic discharge event (ESD event) between the first electrode 500 and the second electrode 600.

Figure 4:
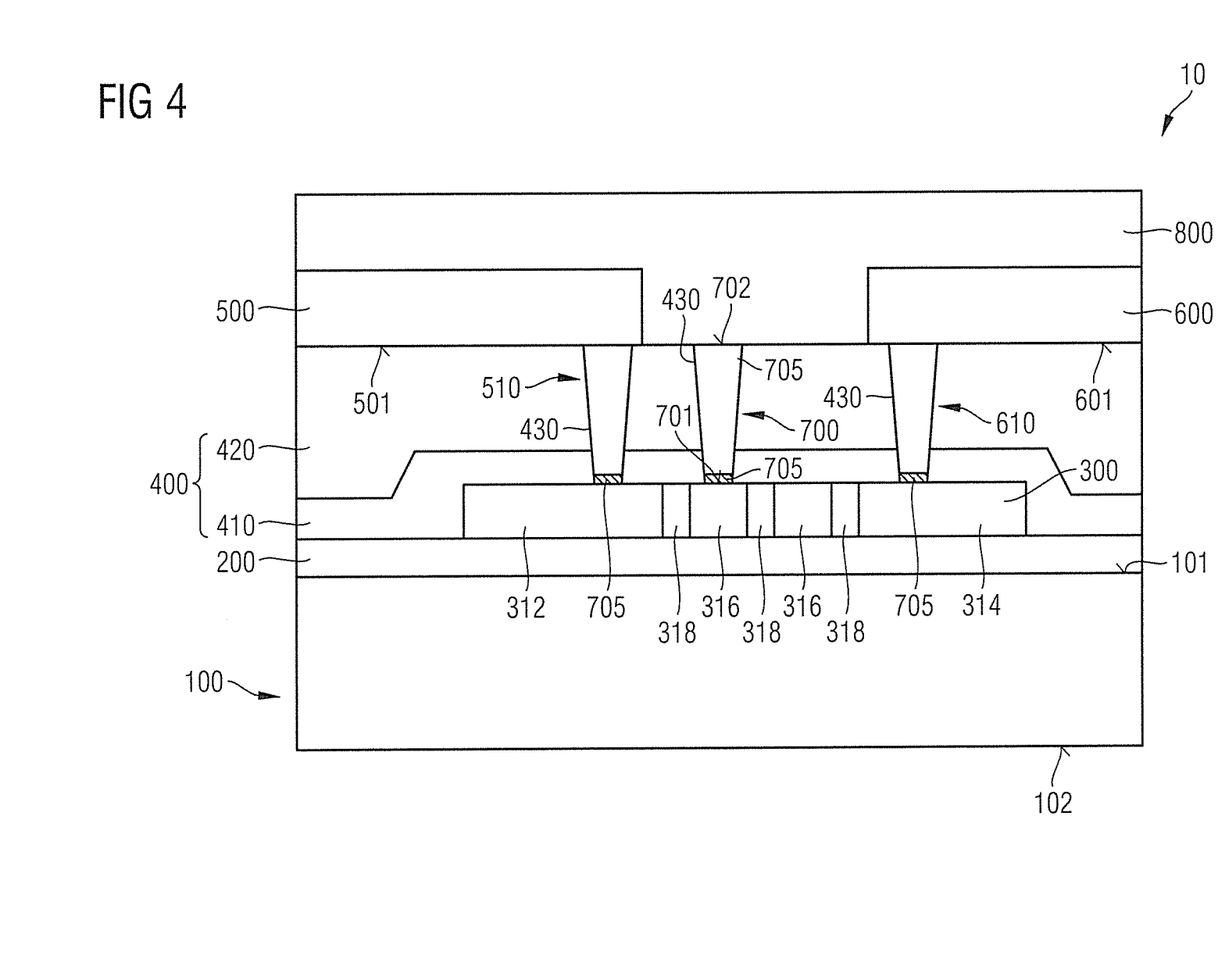
Figure 5A:
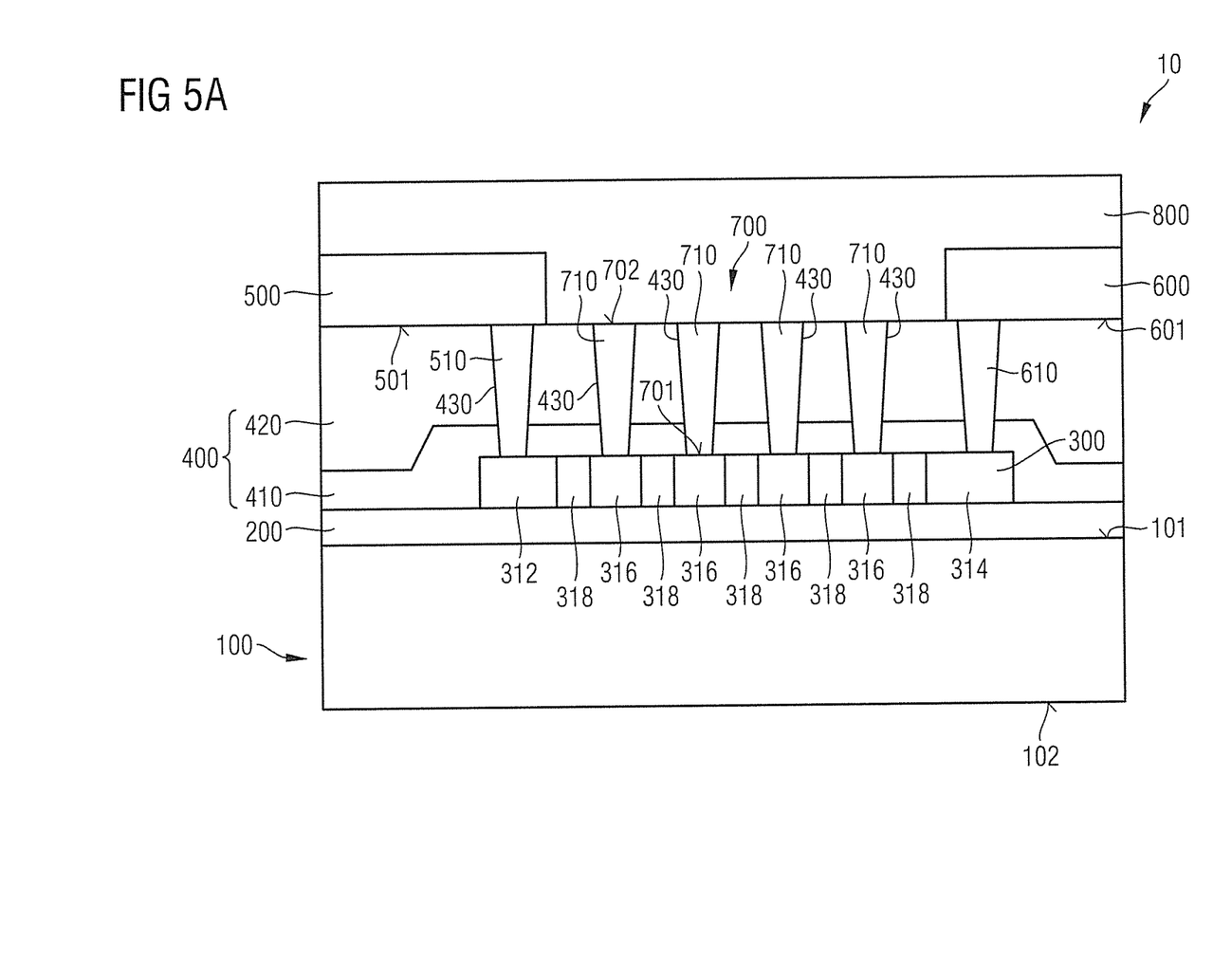
FIGS. 5A to 5C are schematic cross-sectional views of a portion of a semiconductor device taken along a section plane A-A' of FIG. 2A or FIG. 2B in accordance with different embodiments.
Figure 5B:
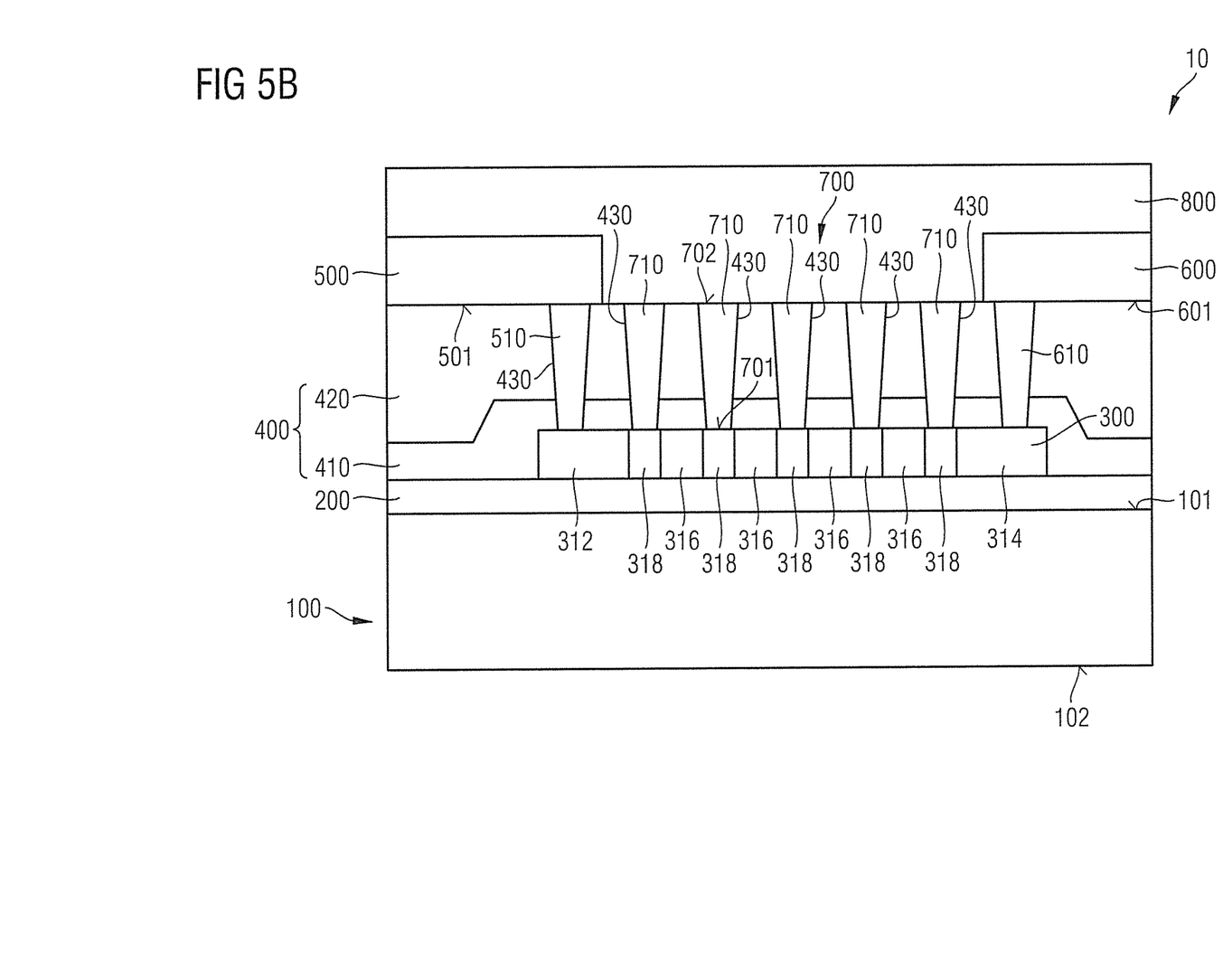
Figure 5C:
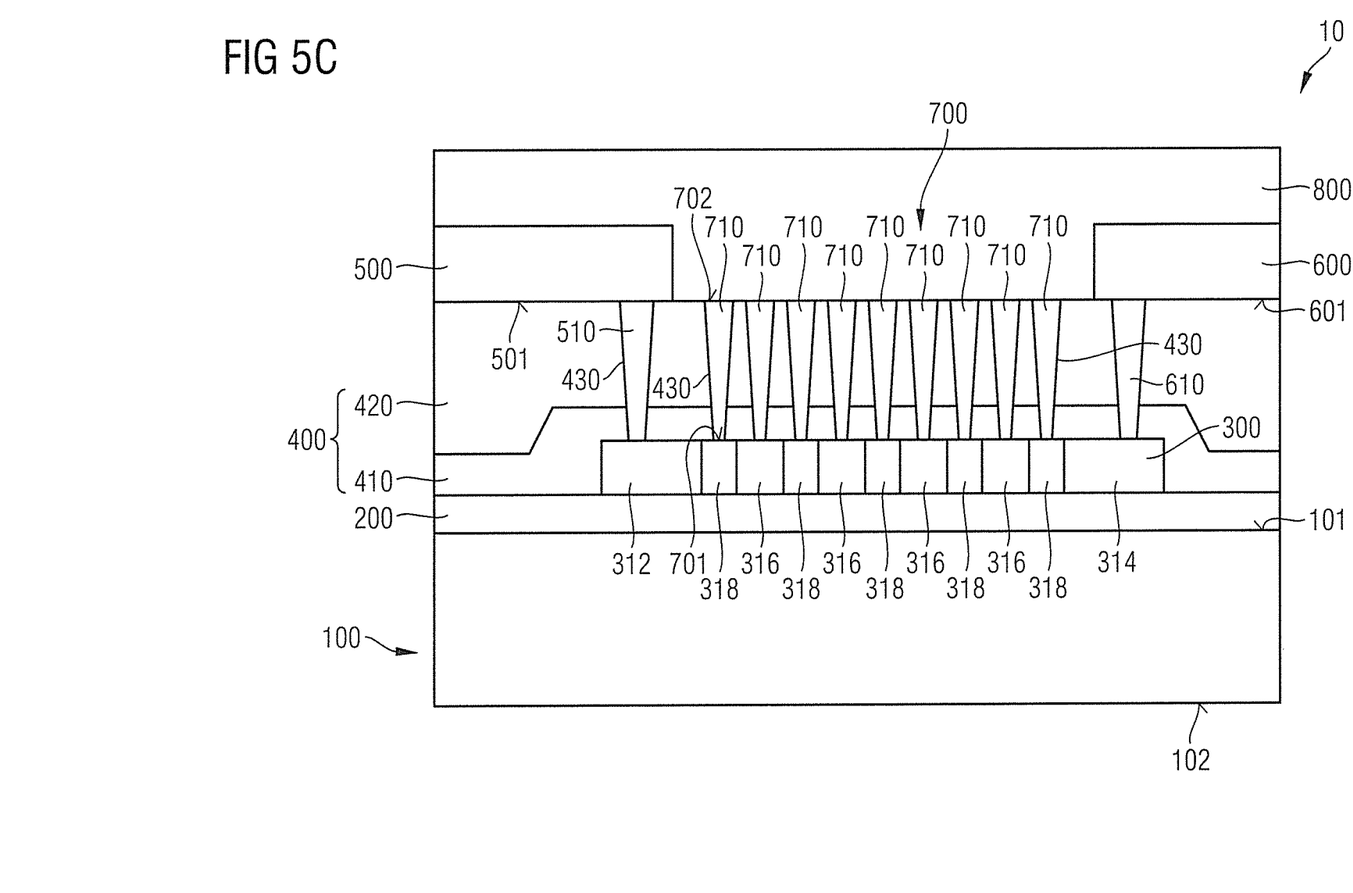

The first electrode 500 is electrically coupled to the first terminal 312 of the electrostatic discharge protection structure 310 via a first contact structure 510 and the second electrode 600 is electrically coupled to the second terminal 314 of the electrostatic discharge protection structure 310 via a second contact structure 610. The heat dissipation structure 700 extends through the second isolation layer 400, wherein the first end 701 is in contact with the electrostatic discharge protection structure 310 and the second end 702 is not in direct electrical contact to any conduction region such as the first electrode 500 or the second electrode 600. As shown in FIGS. 3 to 5, the second end 702 is in direct contact to an electrically isolating region, which is formed by the passivation layer 800 covering the second isolation layer 400. The second end 702 is thus electrically isolated from the first terminal 312 and the second terminal 314 provided that the connection of the second end 702 to the first and second terminals 312, 314 via the first end 701 of the heat dissipation structure 700 and the electrostatic discharge protection structure 310 is not considered. In other words, there is no further conducting path from the second end 702 to the first and second terminals 312, 314 except the conducting path via the first end 701 and the electrostatic discharge protection structure 310. According to an embodiment, the heat dissipation structure 700 may be embedded within an electrically isolating region formed by the second isolation layer 400 and the passivation layer 800, wherein only the first end 701 of the heat dissipation structure 700 is in direct electrical contact to the electrostatic discharge protection structure 310.

The heat dissipation structure 700, the first contact structure 510 and the second contact structure 610 may be formed simultaneously by forming trenches 430 within the second isolation layer 400 and filling the same with an electrically and thermally conducting material such as polysilicon or a metal material. Thus, the heat dissipation structure 700, the first contact structure 510 and the second contact structure 610 may comprise the same material. The metal material of the heat dissipation structure 700, the first contact structure 510 and the second contact structure 610 may comprise tungsten, for example.

The heat dissipation structure 700 may have a cylindrical form, or a tapered form as shown in FIG. 3. The heat dissipation structure 700 may also extend in a lateral direction along the boundary of the first electrode 500 and/or the second electrode 600 (cf. FIGS. 2A and 2B). Both possible arrangements of the heat dissipation structure 700 are illustrated in FIG. 2A. Further rows of heat dissipation elements may be provided, as can be seen, for example in FIG. 5A, which will be discussed below in detail.

The simultaneous formation of the first and second contact structures 510 and 610 together with the heat dissipation structure 700 within trenches 430 extending through the second isolation layer 400 leads to a beneficial manufacturing process. When forming the first electrode 500 and the second electrode 600 on the second isolation layer 400 to be electrically coupled with the first contact structure 510 and the second contact structure 610, respectively, the bottom side 501 of the first electrode 500 and the bottom side 601 of the second electrode 600 are at a same vertical level as the second end 702 of the heat dissipation structure 700. The second end 702 of the heat dissipation structure 700 may be flush with the top surface 402 of the second isolation layer 400 in case the second isolation layer 400 has a planarized top surface 402.

The first contact structure 510, the second contact structure 610 and the heat dissipation structure 700 may be formed by the following process. Firstly, the trenches 430 are formed within the second isolation layer 400, e.g. by an anisotropic etching process. Thereafter, an electrically and thermally conductive material is deposited on the second isolation layer 400 to fill the trenches 430 with the electrically and thermally conductive material. The electrically and thermally conductive material on the top surface of the second isolation layer 400 may be removed by a planarization process, e.g. a chemical mechanical polishing (CMP) process. By this process, a planarized top surface 402 of the second isolation layer 400 is formed, with first and second contact structures 510, 610 and the heat dissipation structure 700. The second end 702 of the heat dissipation structure 700 may be in direct contact with the passivation layer 800 covering the first electrode 500, the second isolation layer 400 and the second electrode 600.

The electrostatic discharge protection structure 310 embedded between the first isolation layer 200 and the second isolation layer 400 has a high thermal impedance due to the thermal isolation by materials like PSG, TEOS, polyoxide or field oxides. Furthermore, the thickness of the electrostatic discharge protection structure 310 along a vertical direction may be less than 1 μm. The thickness of the electrostatic discharge protection structure 310 is limited by the maximal deepness of ion implantation and maximal thermal processing budget for achieving highly doped pn junctions to form the second regions 318 comprising dopants of the second conductivity type, such as boron, overcompensating the first dopants of the first conductivity type, such as phosphorus. Thus, the thickness of the electrostatic discharge protection structure 310 may be in a range of 200 nm to 1000 nm, or in a range of 300 nm to 600 nm, for example. Due to the small thickness of the electrostatic discharge protection structure 310 in comparison to its lateral dimensions, the transient thermal capacity, i.e. the thermal capacity which may buffer short thermal dissipation peaks, is low, which may lead to a deterioration of the electrostatic discharge protection structure 310 or further damages of the semiconductor device 10.

Due to the provision of the heat dissipation structure 700, the thermal capacity of the electrostatic discharge protection structure 310 is increased. A thickness of the heat dissipation structure 700 along a lateral direction (extending from the first terminal 312 to the second terminal 314 of the electrostatic discharge protection structure 310) may be in a range of 100 nm to 3000 nm and a thickness of the heat dissipation structure 700 along a vertical direction may be in a range of 1000 nm to 2000 nm.

Thus, a ratio of a thickness of the heat dissipation structure 700 along a vertical direction and a thickness of the electrostatic discharge protection structure along a vertical direction may be greater than 1, greater than 2, greater than 3, or greater than 10. By providing the heat dissipation structure 700, the effective thickness relevant for the thermal capacity is increased, leading to an improved electrostatic discharge protection structure 310 with enhanced thermal robustness.

The heat dissipation structure 700 and the first and second contact structures 510, 610 may be formed simultaneously and may comprise the same material. The heat dissipation structure 700 and the first and second contact structures 510, 610 may, however, comprise different materials, wherein the first and second contact structure 510, 610 may comprise a material of high electrical conductance and the heat dissipation structure 700 may comprise a material of high thermal conductance regardless of the electrical conductance. For example, the heat dissipation structure 700 may comprise isolating materials with high specific heat such as ceramic components comprising Alumina $Al_2O_3$, for example. Aluminum has a higher specific heat than Silicon together with a good conductivity.

In an embodiment, the heat dissipation structure 700 comprises polysilicon of the first conductivity type, e.g. n-type, and may be in contact with a first region 316 of the polysilicon diode chain being of the first conductivity type, e.g. n-type. Thus, an expanded region of the polysilicon diode chain is provided, which comprises one of the first regions 316 together with the heat dissipation structure 700 having the same conductivity type and having a low thermal impedance.

The heat dissipation structures 700 may abut the top surface 302 of the polysilicon layer 300 with its first end 701. The heat dissipation structure 700 may also penetrate a part of the top surface 302 of the polysilicon layer 300 or may fully penetrate the polysilicon layer 300. The thickness of the second isolation layer may be in a range of 1 μm to 4 μm, or in a range of 2 μm to 3 μm. The second isolation layer 400 may further comprise a silicon nitride layer or a silicon oxide layer containing nitride, wherein the thickness along a vertical direction is in a range of 30 nm to 750 nm. By providing such a layer, the thermal conductivity is further increased.

The contact area of the heat dissipation structure 700 at its first end 701 being in contact with one of the first or second regions 316, 318 has such a form that two neighboring first and second regions 316, 318 are not shunted by the heat dissipation structure 700.

FIG. 4 is a schematic cross-sectional view of a portion of the semiconductor device 10 taken along a section plane A-A' of FIG. 2A or FIG. 2B in accordance with another embodiment. Those features of the embodiment of FIG. 4 being similar to the features of the embodiment of FIG. 3 will not be described again and reference is drawn to the details given above.

As can be seen from FIG. 4, the bottom part of the trenches 430 being in direct contact to the polysilicon layer 300 is lined with a metal silicide layer 705. The metal silicide layer 705 may be formed by depositing a metal layer lining the inner sidewalls of the trenches 430 and may be followed by a silicidation process. The heat dissipation structure 700 thus may include the metal silicide layer 705 being in contact with the electrostatic discharge protection structure 310. The thickness of the metal layer may be in a range of 20 nm to 60 nm, or 40 nm to 50 nm. The metal material may be at least one of titanium, tungsten, or the like. The first and second terminals 312, 314 and the first regions 316 being in contact with the metal silicide layer 705 may be of the second conductivity type, e.g. p-type, and the second regions 318 may be of the first conductivity type, e.g. n-type. The width along a lateral direction of the trenches 430 may be in a range of 100 nm to 3000 nm, the depth along a vertical direction of the trenches 430 may be in a range of 1000 nm to 2000 nm, or in a range of 1400 nm to 1600 nm. The trenches 430 having the metal silicide as an optional layer lining the Si surfaces of the trenches 430 together with an optional barrier stack, e.g. TiN, may be filled with polysilicon or a metal material such as tungsten, Al, AlSi, AlCu, Cu for example.

FIG. 5A to 5C are schematic cross-sectional views of a portion of a semiconductor device 10 along a section plane A-A' of FIG. 2A or FIG. 2B in accordance with further embodiments. Those features of the embodiments of FIGS. 5A to 5C being similar to the features of the embodiments of FIGS. 3 and 4 will not be described again and reference is drawn to the details given above.

As can be seen from FIG. 5A, the heat dissipation structure 700 comprises at least two heat dissipation elements 710, which are electrically isolated from each other. The heat dissipation elements 710 are each in contact with only one of the first and second regions 316, 318, to prevent a shunting of two neighboring first and second regions 316, 318 by one heat dissipation element 710. The heat dissipation elements 710 may comprise polysilicon or a metal such as tungsten and may be in contact with at least two of the first regions 316. In case the heat dissipation elements 710 comprise polysilicon, the heat dissipation elements 710 and the first regions 316 may be of the same conductivity type. The heat dissipation elements 710 may comprise the same material as the first and second contact structures 510, 610 and may be formed simultaneously. As shown in FIG. 5A, the heat dissipation elements 710 may be in contact with all of the first regions 316, to achieve a high thermal transient impedance of the heat dissipation structure 700.

As shown in FIG. 5B, the heat dissipation elements 710 may be in contact with all of the second regions 318. The heat dissipation elements 710 and the second regions 318 may be of opposite conductivity types or may be of the same conductivity type.

As shown in the embodiment of FIG. 5C, the heat dissipation elements 710 are in contact with all of the first regions 316 and the second regions 318, thus maximizing the thermal transient capacity of the heat dissipation structure 700.

By providing the semiconductor device 10, the electrical and thermal characteristics of a cascaded polysilicon diode is improved by providing polysilicon or metal plugs being in contact with the polysilicon diode at their lower sides and not connected at their upper sides. The heat capacitance of the resulting structure is thus enhanced. The improved characteristics of the electrostatic discharge protection structure 310 allows to withstand ESD events with higher dis-charge pulse energy. A further improvement of the ESD peak robustness is achieved by reducing the differential path resistance of the diode chain. The electrostatic discharge protection structure 310 may be employed also in semiconductor devices having a multilayer wiring for integrated circuits.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a semiconductor body having a first surface and a second surface opposite to the first surface,
a first isolation layer on the first surface of the semiconductor body,
an electrostatic discharge protection structure on the first isolation layer, the electrostatic discharge protection structure having a first terminal and a second, different terminal,
a second isolation layer on the electrostatic discharge protection structure,
a first contact structure electrically coupled to the first terminal and a second contact structure electrically coupled to the second terminal, wherein both the first and second contact structures extend vertically through the second isolation layer, and
a heat dissipation structure extending vertically through the second isolation layer and having a first end in contact with the electrostatic discharge protection structure and a second end which is in contact with an electrically isolating region,
wherein the heat dissipation structure is distinct from the first and second contact structures.

2. The semiconductor device of claim 1, wherein the heat dissipation structure, the first contact structure, and the second contact structure comprise the same material.

3. The semiconductor device of claim 1, further comprising a first electrode on the second isolation layer, the first electrode being electrically coupled to the first contact structure.

4. The semiconductor device of claim 3, wherein a bottom side of the first electrode and the second end of the heat dissipation structure is at a same vertical level.

5. The semiconductor device of claim 1, wherein a thickness of the electrostatic discharge protection structure along a vertical direction is less than 1 μm.

6. The semiconductor device of claim 1, wherein a thickness of the heat dissipation structure along a lateral direction is in a range of 100 nm to 3000 nm.

7. The semiconductor device of claim 1, wherein a ratio of a thickness of the heat dissipation structure along a vertical direction and a thickness of the electrostatic discharge protection structure along a vertical direction is greater than 1.

8. The semiconductor device of claim 1, wherein the heat dissipation structure comprises polysilicon.

9. The semiconductor device of claim 1, wherein the heat dissipation structure includes a metal silicide layer being in contact with the electrostatic discharge protection structure.

10. The semiconductor device of claim 1, wherein the electrostatic discharge protection structure comprises a polysilicon layer on the first isolation layer having first and second regions of opposite conductivity type alternatingly arranged along a lateral direction.

11. The semiconductor device of claim 10, wherein the polysilicon layer comprises at least one of a low temperature polysilicon and a continuous grain silicon.

12. The semiconductor device of claim 10, wherein each of the first and second regions comprises first dopants of a first conductivity type, and the second regions further comprise second dopants of the second conductivity type overcompensating the first dopants.

13. The semiconductor device of claim 10, wherein the heat dissipation structure comprises at least two heat dissipation elements electrically isolated from each other and each being in contact with only one of the first and second regions.

14. A semiconductor device, comprising:
a semiconductor body having a first surface and a second surface opposite to the first surface,
a first isolation layer on the first surface of the semiconductor body,
an electrostatic discharge protection structure on the first isolation layer, the electrostatic discharge protection structure having a first terminal and a second terminal, and
a heat dissipation structure having a first end in contact with the electrostatic discharge protection structure and a second end which is in direct contact to an electrically isolating region,
wherein the electrostatic discharge protection structure comprises a polysilicon layer on the first isolation layer having first and second regions of opposite conductivity type alternatingly arranged along a lateral direction,
wherein the heat dissipation structure comprises at least two heat dissipation elements electrically isolated from each other and each being in contact with only one of the first and second regions, and
wherein the heat dissipation elements comprise polysilicon and are in contact with at least two of the first regions, the heat dissipation elements and the first regions being of the same conductivity type.

15. The semiconductor device of claim 13, wherein the heat dissipation elements are in contact with all of the first regions.

16. The semiconductor device of claim 13, wherein the heat dissipation elements are in contact with all of the first and second regions.

17. The semiconductor device of claim 1, wherein the first isolation layer comprises one of a gate dielectric and a field dielectric, the first isolation layer having a thickness in a vertical direction in a range of 5 nm to 3000 nm.

18. The semiconductor device of claim 1, further comprising a second isolation layer on the electrostatic discharge protection structure, the second isolation layer comprising silicon nitride.

19. The semiconductor device of claim 1, wherein the semiconductor device is at least one of a group consisting of a field effect transistor, a superjunction transistor, an insulated gate bipolar transistor, and a trench field effect transistor.

* * * * *